United States Patent
Stenz

(10) Patent No.: US 6,957,406 B1
(45) Date of Patent: Oct. 18, 2005

(54) ANALYTICAL PLACEMENT METHODS WITH MINIMUM PREPLACED COMPONENTS

(75) Inventor: Guenter Stenz, Campbell, CA (US)

(73) Assignee: Xilinx, Inc., San Jose, CA (US)

(*) Notice: Subject to any disclaimer, the term of this patent is extended or adjusted under 35 U.S.C. 154(b) by 2 days.

(21) Appl. No.: 10/273,074

(22) Filed: Oct. 16, 2002

Related U.S. Application Data

(60) Provisional application No. 60/333,979, filed on Nov. 28, 2001.

(51) Int. Cl.[7] ............................................. G06F 17/50
(52) U.S. Cl. ................................. 716/9; 716/8; 716/10
(58) Field of Search .................... 716/9, 8, 10; 364/491; 437/250

(56) References Cited

U.S. PATENT DOCUMENTS

| | | | | |
|---|---|---|---|---|
| 4,630,219 A | * | 12/1986 | DiGiacomo et al. ............ | 716/9 |
| 5,140,402 A | * | 8/1992 | Murakata ..................... | 257/499 |
| 5,308,798 A | * | 5/1994 | Brasen et al. ................ | 438/129 |
| 5,398,195 A | * | 3/1995 | Kim ............................ | 716/10 |
| 5,748,872 A | * | 5/1998 | Norman ....................... | 714/11 |
| 5,812,740 A | * | 9/1998 | Scepanovic et al. .......... | 706/45 |
| 5,867,398 A | * | 2/1999 | Scepanovic et al. .......... | 716/9 |

OTHER PUBLICATIONS

Vijayan, "Overlap elimination in floorplans", Jan. 1991, IEEE, Fourth CSI/IEEE International Symposium on VLSI Design Preceedings, pp. 157–162.*

* cited by examiner

*Primary Examiner*—A. M. Thompson
*Assistant Examiner*—Sun James Lin
(74) *Attorney, Agent, or Firm*—H. C. Chan; Bernard Hoffman; Kim Kanzaki

(57) ABSTRACT

The invention relates to a method for placing design components of an integrated circuit. A first site is selected. Other sites that are at maximum distances from already used sites may be selected. Components that have minimum connectivity to already placed components are selected. These components are used for preplacement. Preferably, the number of preplaced components is small. The rest of the design components are placed. An overlap ratio is computed. If the overlap ratio is above a predetermined value, the result is unplaced and additional components are preplaced. Another placement is performed. Overlap ratio is again computed. The steps of unplacing, adding preplaced components and computing overlap ratio are repeated until the overlap ratio falls below the predetermined value.

7 Claims, 4 Drawing Sheets

ANALYTICAL PLACEMENT METHODS WITH MINIMUM PREPLACED COMPONENTS

FIELD OF THE INVENTION

This invention relates to computer-aided design (CAD), and specifically, to placement of design objects in an integrated circuit.

BACKGROUND OF THE INVENTION

The design process for many integrated circuits ("chips") typically contains a number of well known sequential operations. Initially, the proposed functionality of a circuit is analyzed by one or more chip designers. These designers then use design capture tools to enter the logical components of the circuit and their interactions. This step involves generating a description of the logic design to be implemented on the circuit chip in an appropriate machine-readable form. One of the commonly used methods for specifying a design is hardware description language (HDL). This language contains specific functions and syntax to allow complex hardware structures to be described in a compact and efficient way. Logic synthesis tools are available to compile the HDL description specifying the design into lower forms of description. The output of these design tools is a logic design database which completely specifies the logical and functional relationships among the components of the design.

The logic design database is then passed as input to a layout tool, which typically includes a placement tool (placer) and a routing tool (router). Placement is the process whereby each component (or design object) of the design is allocated to a physical position on the chip. The aim of the placer is to place connected design objects in close physical proximity to one another. This conserves routing resources on the chip and increases the probability that the desired interconnections will be successfully completed by the router. Additionally, the performance of the circuit may be improved because excess capacitance and resistance caused by long interconnect paths between design objects will slow down the circuit and, in certain cases, delay critical signals and possibly cause functional failures. Placement may take place either manually or automatically, or in combination. If placement is done manually, a chip designer interacts with a placement tool to define the location on the chip where each design object is to be placed. Automatic placement relies on sophisticated algorithms to place the design objects on the chip without the need for human intervention. As circuits get more complex and device geometry becomes sub-micron, it is rapidly becoming extremely difficult for a human chip designer to manage the complexity of the placement and routing operations. For example, modern designs contain tens of thousands of design objects, making the time needed for complete manual placement prohibitive.

After placement is complete, a routing step is performed. The purpose of routing is to connect the pins in each net of a logic design. A net is a collection of pins that must be connected together electrically by the router. A net may have one or more driver pins and one or more load pins. The driver pins on a net are the source of electrical signals that are fed to the load pins through an interconnection path chosen by the router. The position of the pins in any particular net are decided by the placement process. Routing determines exactly the interconnection paths between driver and load pins on a net. The routing problem can be significantly reduced in complexity if a near-optimal placement of the design objects has been achieved.

After placement and routing, it is often necessary to verify that the design functions in ways expected by the designer. This verification may be achieved by simulation. During post-layout verification, the operation of the logic design is examined. After routing, the precise resistances and capacitances of a design's interconnections are known and consequently, post-layout tools have an accurate picture of the actual circuit in the time domain. The post-layout verification of the design validates time-critical areas and detects glitches and other timing errors. After post-layout verification, masks and test patterns are typically generated for use in manufacturing and testing the circuit.

The design tools involved in the CAD flow that are used for verification and transforming an HDL circuit into a routed circuit are commonly implemented in software executing on an engineering workstation.

It can be seen from the above that placement has an important effect on performance and routability. Thus, it is desirable to generate a placement solution that is as optimal as possible.

SUMMARY OF THE INVENTION

The invention relates to a method for placing design components of an integrated circuit. A set of components is preplaced. Preferably, the number of preplaced components is small. The rest of the design components are placed. As is well known in the CAD community, an analytical placement algorithm may provide a result that places more than one component in the same location (i.e., overlaps). An overlap ratio is computed. If the overlap ratio is above a predetermined value, the result is unplaced and additional components are preplaced. Another placement is performed. Overlap ratio is again computed. The steps of unplacing, adding preplaced components and computing overlap ratio are repeated until the overlap ratio falls below the predetermined value.

The above summary of the present invention is not intended to describe each disclosed embodiment of the present invention. The figures and detailed description that follow provide additional example embodiments and aspects of the present invention.

DETAILED DESCRIPTION OF THE INVENTION

The present invention relates to placement tools used to design an integrated circuit. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

One type of integrated circuit that may use the placement method of the present invention is programmable logic device (PLD). An example of a PLD is field programmable gate array (FPGA). A typical FPGA architecture includes an array of configurable logic blocks (CLBs) surrounded by programmable input/output blocks (IOBs). The CLBs and IOBs are interconnected by a hierarchy of programmable routing resources. These CLBs, IOBs, and programmable routing resources are customized by loading a configuration bitstream into the FPGA.

It is well known that conventional analytical placement methods require some preplaced components in order to obtain a meaning solution. In many cases, the preplaced components are the input-output (IO) components that are generally located at the perimeter of a chip. One aspect of the present invention is a method to remove this requirement. In the present invention, the components at the perimeter could be any components (i.e., not limited to IOs) and the IO components could be located anywhere in the chip (i.e., not limited to the perimeter of the chip). However, for illustrative purposes, it is assumed that only IO components are located at the perimeter in the examples shown below.

Figure 1:
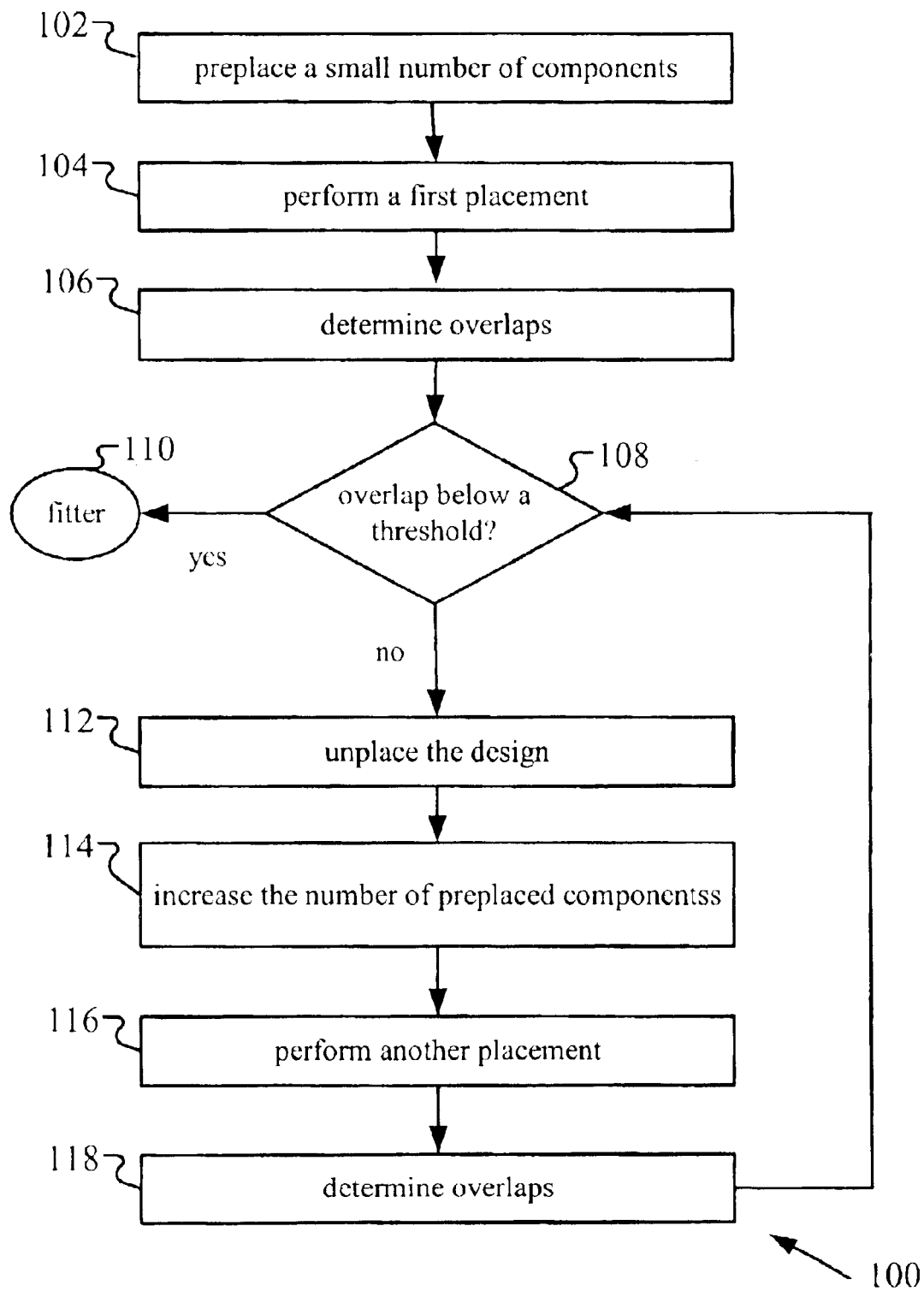
FIG. 1 is a flow chart showing an operation of the present invention.

FIG. 1 is a flow chart showing an operation 100 of the present invention. In step 102, a small number of I/O components are preplaced around the perimeter of the chip. In the case of a FPGA, the IOs may be the IOBs. In one embodiment, approximately sixteen IOs may be preplaced (four on each side of a square-shaped chip). In step 104, a first placement is performed. Any analytic placement tool can be used to perform this step. As is well known in the CAD community, an analytical placement method may provide a solution that places more than one component in the same location (i.e., there may be overlaps). In step 106, overlaps in the placement are determined. This step can be performed using conventional software tools. In step 108, a ratio between the number of overlapping components and the total number of placement objects is calculated (called herein the "overlap ratio"). If this ratio is below a predetermined threshold, it means the placement of step 104 yielded satisfactory result. In one embodiment, the threshold is 50%. The result is then sent to a final placement tool (sometimes called a fitter) to remove the overlaps (step 110). In this step, conventional fitter tools can be used. For example, many fitters use a breadth-first search (BFS) algorithm to search for empty sites to place the overlapping components.

If the overlap ratio is higher than the threshold, the design is unplaced, with the exception of the previously preplaced components (step 112). Additional IOs are preplaced (step 114). In step 116, a new placement is performed (in a similar manner as step 104). In step 118, a new overlap ratio is determined. This ratio is processed in accordance with step 108 above. It is believed that the additional preplaced IOs can reduce the overlaps in the subsequent placement, although the resulting placement may not be as optimal.

Figure 2:
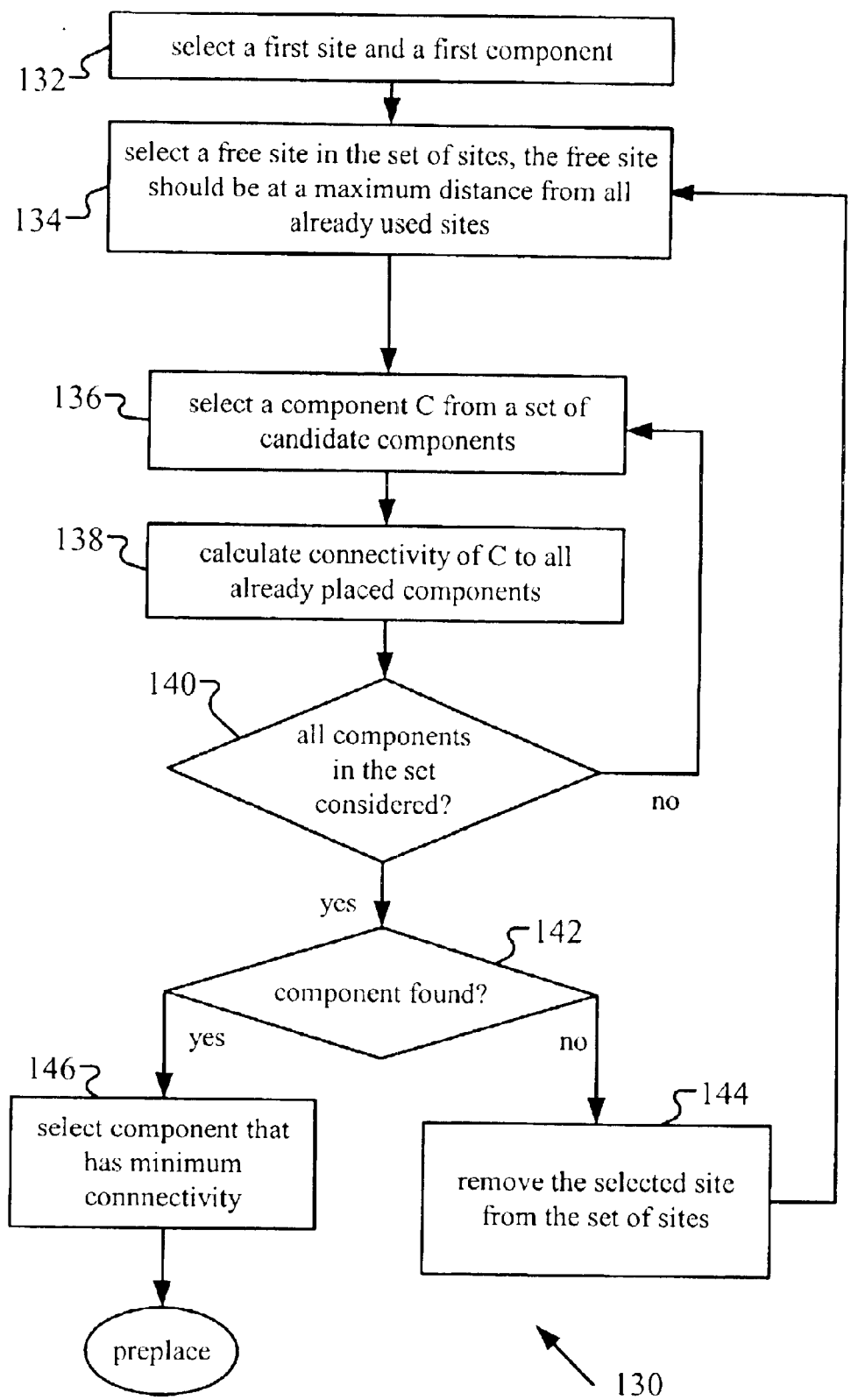
FIG. 2 is a flow chart showing the steps in preplacing components in accordance with the present invention.

Details of step 102 (preplacing components) are described in a flow chart 130 of FIG. 2. One way of preplacing is to randomly place a small number of components. However, randomly placing even a small number of components may severely harm placement quality when these components are connected by critical paths. To avoid this negative effect, a set of components that has minimum connectivity among its members is chosen for preplacement. In the present invention, a netlist can be modeled as an undirected graph.

The nodes of the graph represent components to be placed and the undirected edges represent the connections between the components. The strength of connectivity between two components is defined as the logical length of the shortest path between the nodes representing these two components in the graph. The logical length of a path is the number of edges in the path between the two components. The shorter the logical length, the stronger is the connectivity.

In preplacing components, a set of candidate sites is identified. For the purposes of preplacing IOs, the candidate sites are generally located at the perimeter of the chip. A set of candidate components is also identified. For the purpose of preplacing IOs, the candidate components are IOBs. In step 132, a component and a site on which this component can be legally placed are randomly chosen. This component is preplaced on this site. In step 134, another site is chosen from the not-yet-used candidate site (called free site) under the condition that the distance between the free site and the already used site(s) is at a maximum. In one embodiment, the distance is the Euclidean distance.

Figure 3:
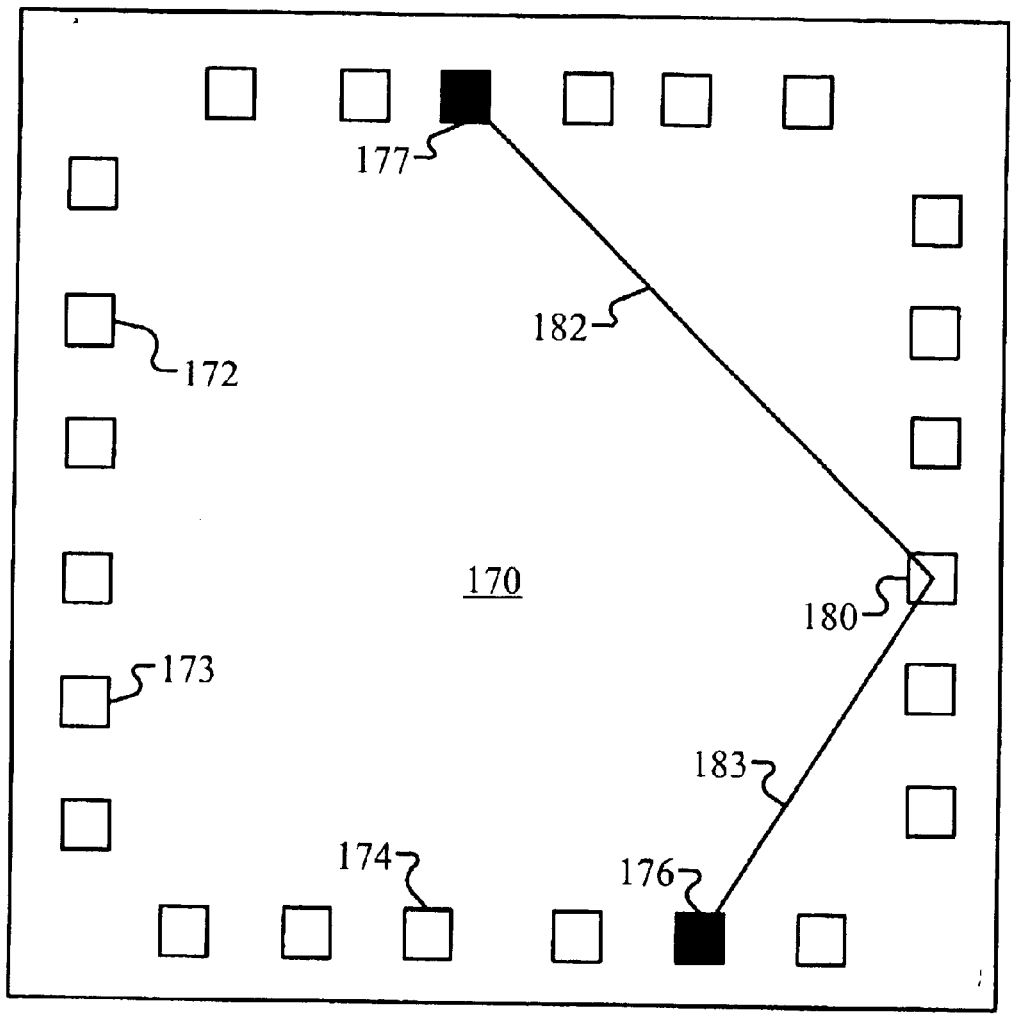
FIG. 3 is a schematic diagram showing a plurality of sites of the present invention.

FIG. 3 is a diagram that illustrates step 134. It shows a PLD 170 that has a plurality of sites (such as candidate sites 172–174). Some of the sites are already used (such as sites 176 and 177, shown in dark). In order to determine whether a free site 180 should be selected under step 134, its distance from the already used sites 176 and 177 is calculated. In one embodiment, this distance is the sum of the length of the lines 182 and 183. In another embodiment, this distance is the minimum of the length of lines 182 and 183. Note that other ways of defining distances may also be used.

Returning to FIG. 2, a component is selected from the set of candidate components (step 136). The connectivity of this selected component from all the already placed components is calculated (step 138). In order to find the component that has the minimum connectivity, all the components in the set of candidate components need to be considered. In step 140, it is determined whether all the components have been considered. If not all components have been considered, another component in the set of candidate components is selected for consideration. In this case, flow chart 130 branches back to step 136. If all the components have been considered, it is determined whether a component has indeed be found (step 142). This is because in some case, no component can be found to be able to use the free site. If no component can be found, the free site selected under step 134 is removed from the set of candidate sites (step 144). Flow chart 130 branches back to step 134 to select another site. If at least one component is found, the component that has the minimum connectivity is selected (step 136). This component is used for preplacement.

The steps in flow chart 130 can be repeated if there is a need to select more than one component for preplacement.

One way to determinate the connectivity is now described. As explained above, a netlist can be modeled as an undirected graph wherein nodes represent components and edges represent connections. A breadth-first search (BFS) is executed on the undirected graph. During execution of the BFS, a level is assigned to each node in the graph, starting with a value, such as zero. In flow chart 130 of FIG. 2, all nodes associated with the already placed components are assigned level zero. All not-yet assigned nodes that are connected to nodes of level zero are assigned level one. All not-yet assigned nodes that are connected to nodes of level one are assigned level two. This assignment of level continues until the end of the graph is reached. The level of a node represents the smallest number of edges of any path from a node of level zero to this particular node. Thus, the level of a node is inversely related to the connectivity between this node and any node of level zero. This means that the higher is the level, the lower is the connectivity. In the present invention, the not-yet-placed component from the set of candidate components that has the lowest connectivity (or the corresponding node with the highest level) is selected for preplacement on a site.

Figure 4:
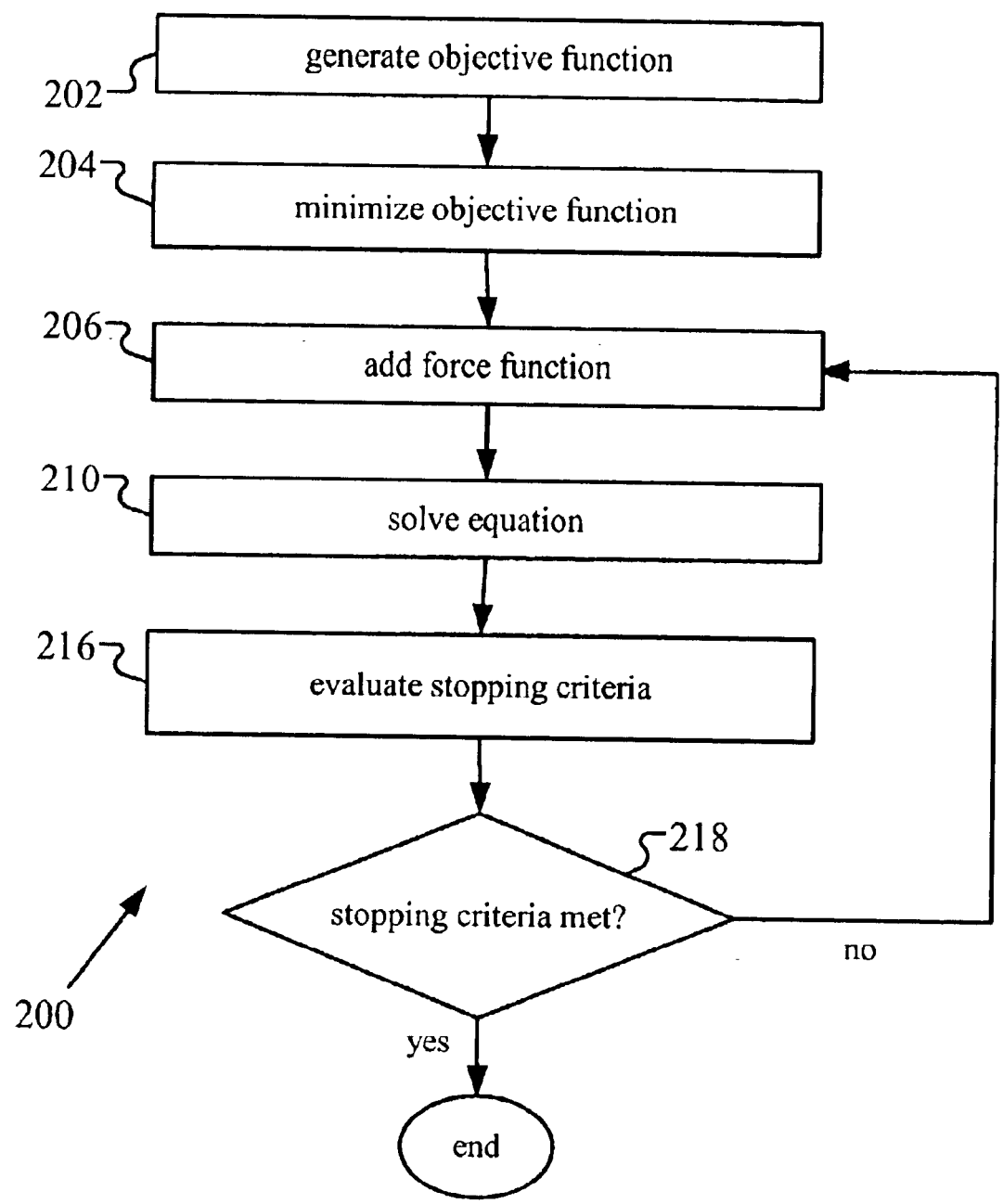
FIG. 4 is flow chart of a single placement step of the present invention.

After a certain number of components have been preplaced, a placement is performed (e.g., step 104 or 116 of FIG. 1). The main goal of placement is to assign all design objects onto the sites of the FPGA so that the router can route all nets using minimum routing resources and causing minimum connection delays. One example of an analytical placement method that uses the preplaced components is described in detail here. A flow chart of this placement method 200 is shown in FIG. 4.

In step 202, an objective function, defined as the sum of all net lengths, is generated. In this step, a net is modeled as a clique. The length of a net is modeled as the sum of the squared lengths of all edges in the clique. For example, for a three-pin net n, the net length l, is given by:

$$l_n = g_n[(x_k-x_l)^2 + (x_k-x_m)^2 + (x_l-x_m)^2 + (y_k-y_l)^2 + (y_k-y_m)^2 + (y_l-y_m)^2]$$

where $x_k$, $x_l$, $x_m$ and $y_k$, $y_l$, $y_m$ are the x- and y-coordinates of the three connected pins, respectively, and $g_n$ is the weight of the net. In the above equation, the weight $g_n$ is preferably chosen according to the time-criticality of the net (e.g., as determined by a timing analyzer): the more critical is the net, the higher is the weight. This is because higher weight means more contribution to the objective function, which causes the placer to put more emphasis in reducing the length of this net. As can be seen from the above Equation, wire length in the x- and y-directions can be minimized independently. Summing up the lengths of all nets in x-direction, it is possible to write in vector-matrix notation:

$$L_x = \vec{x}^T A \vec{x} + \vec{b}^T \vec{x} + c \qquad (1)$$

where x is a m-vector containing the x-coordinates of the m movable components, A is a m×m Matrix, $\vec{b}$ is a m-vector and c is a constant. A similar equation can be written for the y-direction.

In step 204, the objective function is minimized in the x- and y-directions individually, which generates x- and y-coordinates for all components. Focusing on the x-direction, minimizing $L_x$ requires the first partial derivatives to be zero, which yields the m×m equation below:

$$2A\vec{x} + \vec{b} = \vec{0} \qquad (2)$$

This equation can be solved with a standard conjugate gradient method. Equation 1 can be illustrated by replacing the nets by springs. In this case, Equation 1 finds the state of minimum system energy and Equation 2 means that at each component the sum of the forces caused by all connected springs is 0. Solving the linear equation of equation 2 provides a placement with minimum net length but significant overlaps.

In step 206, a force function is added to the vector $\vec{b}$ in equation (2). The force function serves to reduce overlap of components. To determine the force function, the FPGA is logically divided into an array of (preferably) rectangular tiles. The force function at a tile $\vec{r}$ is given by:

$$\text{force}(\vec{r}) = K \sum_{r'} \text{density}(r') \frac{\vec{r} - \vec{r'}}{|\vec{r} - \vec{r'}|^2}$$

where K is a constant that determines the relative strength of the additional force compared with the forces generated by the nets, $\vec{r'}$ represents the coordinate of tile r', and density(r)= demand(r)−capacity(r).

In the equation above, demand(r) is the number of components currently placed in this tile r, and capacity(r) is the number of available locations in the same tile. The parameter K determines the strength of the force, which in turn determines how quickly the components are spread out over the chip. It is often assigned on a case-by-case basis. The force function can be applied to all components in a FPGA. Specifically, if it is applied to the IOs, the capacity of a tile is assigned zero value within the core of the FPGA and greater than zero only around the perimeter of the FPGA where the IO sites are located.

In step 210, equation (2) together with an associated force is solved. In step 216, a stopping criterion is evaluated. In one embodiment, the stopping criteria consists of two elements: (a) the overlap ratio and (b) the distances of all the IOs from the perimeter of the FPGA. The overlap ratio is preferably below a predetermined value (such as 20%). This predetermined value is generally different from the threshold of FIG. 1. The distances of all the IOs from the perimeter of the FPGA is preferably below 15% of the chip perimeter. In step 218, method 200 determines whether the stopping criterion is met. If the answer is positive, method 200 terminates. Otherwise, method 200 loops back to step 206 to perform another iteration.

Figure 5:
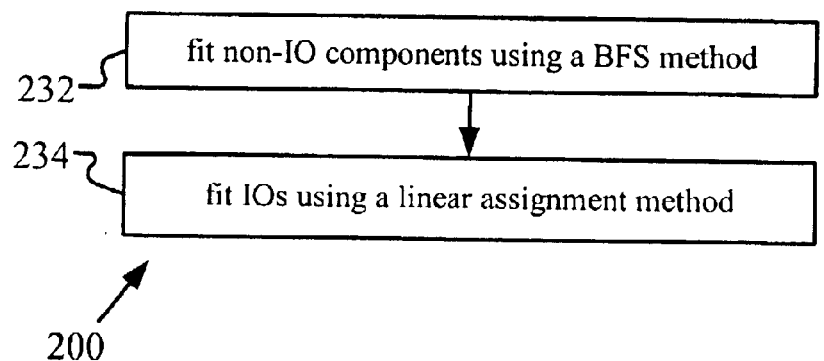
FIG. 5 is a flow chart of a fitter of the present invention.

As explained above in FIG. 1, a fitter is used to remove overlaps resulted from a placement. An example of fitting steps of the present invention is described in a flow chart 230 of FIG. 5. In step 232, the non-IO components are fitted using a breadth-first search algorithm. These components are processed in order of their criticality. Every component is fitted onto an empty site that is closest to the location determined by the placement method 200 of FIG. 4. The breadth-first search algorithm can also be used to fit the IOs. In another embodiment of the present invention, the IOs placed by method 200 are fitted using a linear assignment method that minimizes the sum of all distance the IOs have to be moved from their placed location to their final site (step 234). The comparatively small number of IOs makes it feasible to apply linear assignment for fitting.

It can be seen from the above description that a novel computer-aided design method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

I claim:

1. A method for placing a set of components, comprising:

identifying a set of candidate sites;

identifying a set of candidate components;

selecting a first free site from said set of candidate sites;

selecting a first unplaced component from said set of candidate components for placing into said first free site;

locating a second free site from said set of candidate sites that has. a maximum distance from said first free site; and selecting a second unplaced component from said set of candidate components for placing into said second free site, said second unplaced component having a minimum connectivity with said first unplaced component.

2. The method of claim 1 wherein said set of candidate components contains input-output blocks.

3. The method of claim 1 wherein said candidate sites are located at a perimeter of an integrated circuit.

4. The method of claim 1 wherein said candidate components are represented by nodes in an undirected graph, and said connectivity is associated with logical length between said nodes.

5. The method of claim 1 further comprising:

generating an objective function;

minimizing said objective function to obtain an equation; and solving said equation.

6. The method of claim 5 further including adding a force function into the equation.

7. The method of claim 1 further comprising:

location another free site from said set of candidate sites that has a maximum distance from already located sites; and selecting another unplaced component from said set of candidate components for placing into said another free site, said another unplaced component having minimum connectivity with already selected components.

* * * * *